(12) United States Patent
Yandoc et al.

(10) Patent No.: US 12,224,180 B2
(45) Date of Patent: Feb. 11, 2025

(54) SEMICONDUCTOR DEVICE AND A METHOD OF MANUFACTURING A SEMICONDUCTOR DEVICE

(71) Applicant: NEXPERIA B.V., Nijmegen (NL)

(72) Inventors: Ricardo Yandoc, Nijmegen (NL); Anthony Matthew, Nijmegen (NL); Manoj Balakrishnan, Nijmegen (NL); Adam Brown, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 459 days.

(21) Appl. No.: 17/518,862

(22) Filed: Nov. 4, 2021

(65) Prior Publication Data
US 2022/0139724 A1   May 5, 2022

(30) Foreign Application Priority Data
Nov. 4, 2020 (EP) ..................... 20205690

(51) Int. Cl.
*H01L 21/48* (2006.01)
*B23K 20/10* (2006.01)
(Continued)

(52) U.S. Cl.
CPC .......... *H01L 21/4821* (2013.01); *B23K 20/10* (2013.01); *B23K 2101/40* (2018.08); *H01L 2021/60007* (2013.01)

(58) Field of Classification Search
CPC ....... H01L 21/4821; H01L 2021/60007; H01L 23/49524; H01L 23/49562; H01L 23/49541; H01L 23/4334; H01L 24/41; H01L 24/27; H01L 24/29; H01L 24/40; H01L 24/84; H01L 24/37; H01L 24/35; H01L 2224/2741; H01L 2224/2747; H01L 2224/29101; H01L 2224/352; H01L 2224/35985; H01L 2224/83192; H01L 2224/84815; H01L 2224/4103; H01L 2224/83801; H01L 2224/84801; H01L 2224/32245; H01L 2924/00014;
(Continued)

(56) References Cited

U.S. PATENT DOCUMENTS

| 11,830,810 B2 * | 11/2023 | Flowers ................. H01L 24/33 |
| 2008/0036078 A1 * | 2/2008 | Herbsommer .......... H01L 24/38 |
| | | 438/117 |

(Continued)

FOREIGN PATENT DOCUMENTS

| CN | 204857710 U | 12/2015 | |
| KR | 20150129269 | * 11/2015 | ............. H01L 23/34 |

(Continued)

OTHER PUBLICATIONS

Extended European Search Report for corresponding European application EP20205690.9 9 pages dated May 3, 2021.

*Primary Examiner* — Herve-Louis Y Assouman
*Assistant Examiner* — Linda J. Fleck
(74) *Attorney, Agent, or Firm* — Ruggiero McAllister & McMahon LLC

(57) ABSTRACT

A semiconductor device including a clip, and the clip includes a clip slot, and a slug and the slug includes a groove. The clip and the slug are attached by the ultrasonic welding. The groove and the clip slot are at least partially overlapping to form a gas pathway.

13 Claims, 4 Drawing Sheets

(51) Int. Cl.
B23K 101/40 (2006.01)
H01L 21/60 (2006.01)

(58) Field of Classification Search
CPC .......... H01L 2924/10253; H01L 2924/13091; B23K 20/10; B23K 2101/40
See application file for complete search history.

(56) References Cited

U.S. PATENT DOCUMENTS

| | | | | |
|---|---|---|---|---|
| 2009/0218663 | A1* | 9/2009 | Bauer | H01L 23/49541 |
| | | | | 438/123 |
| 2010/0148346 | A1* | 6/2010 | Quinones | H01L 23/4334 |
| | | | | 257/676 |
| 2011/0227207 | A1* | 9/2011 | Yilmaz | H01L 23/49524 |
| | | | | 257/676 |
| 2013/0083489 | A1* | 4/2013 | Dimauro | H05K 1/111 |
| | | | | 361/679.01 |
| 2016/0172276 | A1* | 6/2016 | Arokiasamy | H01L 21/4842 |
| | | | | 257/676 |
| 2016/0365305 | A1* | 12/2016 | Ding | H01L 23/3107 |
| 2018/0240770 | A1* | 8/2018 | Choi | H01L 23/4334 |
| 2019/0273040 | A1* | 9/2019 | Mohn | H01L 21/565 |
| 2020/0176342 | A1* | 6/2020 | Choi | H01L 23/3735 |
| 2020/0402873 | A1* | 12/2020 | Kohama | H01L 23/13 |
| 2021/0005538 | A1* | 1/2021 | Yandoc | H01L 23/49555 |
| 2021/0233839 | A1* | 7/2021 | Calo | H01L 24/40 |
| 2022/0293490 | A1* | 9/2022 | Koini | H01L 23/473 |

FOREIGN PATENT DOCUMENTS

| | | |
|---|---|---|
| TW | M577176 U | 4/2019 |
| WO | 2006068643 A1 | 6/2006 |

* cited by examiner

SEMICONDUCTOR DEVICE AND A METHOD OF MANUFACTURING A SEMICONDUCTOR DEVICE

CROSS REFERENCE TO RELATED APPLICATION

This application claims the benefit under 35 U.S.C. § 119(a) of European Application No. 20205690.9 filed Nov. 4, 2020, the contents of which are incorporated by reference herein in their entirety.

BACKGROUND OF THE DISCLOSURE

1. Field of the Disclosure

The present disclosure relates to a method of forming a semiconductor device. The disclosure also relates to a method of manufacturing a semiconductor device.

2. Description of the Related Art

Ultrasonic welding as an industrial process is known in the art. Ultrasonic welding uses high-frequency ultrasonic acoustic vibrations that are locally applied to workpieces being held together under pressure to create a solid-state weld. Ultrasonic welding is commonly used in the industry for plastics and metals, and it can be also used for joining dissimilar materials. In ultrasonic welding, there are no connective bolts, nails, soldering materials, or adhesives necessary to bind the materials together. When ultrasonic welding is used for metals, a notable characteristic of this method is that the temperature stays well below the melting point of the involved materials. This prevents any unwanted properties which may arise from high temperature exposure of the metal materials.

The known applications of ultrasonic welding are extensive and can be found in many industries including electrical and computer, automotive and aerospace, medical, packaging, semiconductor industry, etc. Whether two items can be ultrasonically welded is determined by their thickness. If they are too thick this process will not join them. This is the main obstacle in the welding of metals. However, wires, microcircuit connections, sheet metal, foils, ribbons and meshes are often joined using ultrasonic welding.

In the semiconductor, electrical and computer industry ultrasonic welding is often used to join wired connections and to create connections in small, delicate semiconductor circuits.

One of the areas in which ultrasonic welding is most used and where new research and experimentation is cantered is microcircuits. Ultrasonic welding process is ideal for microcircuits since it creates reliable bonds without introducing impurities or thermal distortion into components. Semiconductor devices, transistors and diodes are often connected by thin aluminium and gold wires using ultrasonic welding. Ultrasonic welding is also used for bonding wiring and ribbons as well as entire chips to microcircuits.

The ultrasonic welding is advantageous in terms of improving the power cycling reliability and production throughput when compared to traditional joining techniques such as soldering.

In case of a MOSFET semiconductor device, the ultrasonic welding can be used for welding a slug to a clip. Such clip with the welded slug is soldered to a silicon MOSFET die. In this case a gas can be trapped during said soldering, which can cause a solder voiding. When this process is used for the manufacturing of semiconductor transistor device, such an excess solder can spread along edge of a clip, which can easily cause the potential bridging to gate or drain terminals of the transistor.

SUMMARY

Various example embodiments are directed to the disadvantage as described above and/or others which may become apparent from the following disclosure.

According to an embodiment of this disclosure a semiconductor device comprises a clip, wherein the clip comprises a clip slot, and a slug, wherein the slug comprises a groove. The clip and the slug are connected to each other by an ultrasonic welding. The groove and the clip slot are at least partially mutually overlapping so to form a gas pathway. The groove is positioned on an underside of the slug, wherein the slug is connected to the clip via this underside.

According to an embodiment of this disclosure a semiconductor device further comprises a leadframe, a first solder positioned on the top of the leadframe, a silicon die positioned on the top of the first solder, a second solder positioned on the top of the silicon die, wherein the clip is positioned on the top of the second solder.

According to an embodiment of this disclosure the semiconductor device comprises at least two grooves and at least two clip slots. These grooves and the clip slots can overlap fully or partially with each other. These grooves and the clip slots can be of various shapes.

According to an embodiment of this disclosure the grooves and the clip slots overlap significantly, and they form a cross-shape or a plus-shape.

According to another embodiment of this disclosure the grooves and the clip slots overlap partially. The grooves and the clip slots form a rectangle-shape, wherein the grooves correspond to first two sides of the rectangle-shape and the clip slots correspond to second two sides of the rectangle-shape, and the overlapping between the grooves and the clip slots is only at vertices of the rectangle-shape.

The disclosure also relates to a method of producing a semiconductor device as described in the above embodiments.

The disclosure relates to a method of producing a semiconductor device, the method comprising steps:
- solder stencil printing to a die pad,
- attaching a die to the die pad,
- dispensing a solder on the top of the die,
- attaching a slug to a clip using an ultrasonic welding, wherein the slug comprises a groove and wherein the clip comprises a clip slot, wherein the groove and the clip slot are at least partially overlapping when attaching the slug to the clip, and wherein the groove is positioned on a side of the slug to which is the slug attached to the clip, and
- molding, PMC deflash and plating.

The semiconductor device according to the embodiments of the disclosure significantly improves the solderability and the final solder quality. This significantly reduces the likelihood of voids.

Creating the gas pathway, as described above, secures that any present gas will be eliminated during the solder reflow process. This decreases the chance of void formation in the solder between the die and clip. This means that the final thermal and electrical performance of the device, e.g. RDSon, is increased.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope.

The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

DETAILED DESCRIPTION

According to an embodiment of the disclosure, a semiconductor device comprises a slug, which slug comprises a groove or a tunnel on the underside of the slug. The slug is on its underside ultrasonic welded to a slotted clip for dual side cooling packages.

The above described design enables a flux outgassing during a solder reflow, since the groove creates a passage, so that gas can escape through this passage. This is achieved though grooves or tunnels that can be positioned across the full length of the slug and which are at least partially overlap with the slots on the clip.

In various embodiments of the present disclosure, the groove(s) and the slot(s) may have (reasonably) the same, similar or a different geometry. The essential feature of the disclosure is that the groove(s) and the slot(s) overlap with each other. In this way it is enabled that there is a continuous path from a solder under the clip through the slots, into the groove(s) of the slug, and then outside of the slug.

The overlap of the slots and the grooves also helps to manage the coefficient of thermal expansion (CTE) of these parts, which significantly improves the reliability of the semiconductor device.

The above described embodiment of the disclosure solves the described disadvantage, as present in the semiconductor devices known in the art, since the embodiment of the disclosure improves the solderability and final solder quality by reducing the likelihood of voids.

Through the use of a groove or a tunnel in the slug that is at least partially overlapping with the clip slots, a pathway will be formed, which pathway will secure that any present gas will escape (i.e. will be eliminated) during the solder reflow process. This directly decreases the chance of void formation in the solder between a die and a clip. It is very important to prevent the formation of these voids, since voids can affect the final thermal and electrical performance of the semiconductor device, e.g. a drain-source on resistance (RDSon) in case of the transistor semiconductor device.

Figure 1A:
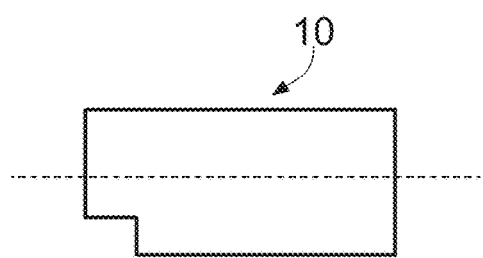
FIGS. 1a, 1b, 1c, 1d and 1e illustrate a semiconductor device according to an embodiment of the disclosure.
Figure 1B:
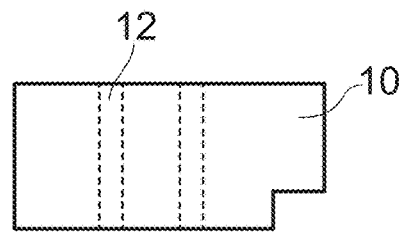
Figure 1C:
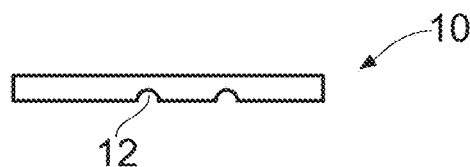
Figure 1D:
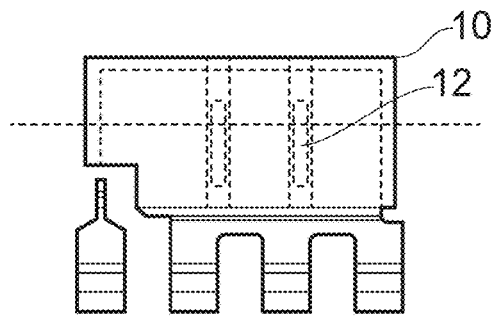
Figure 1E:
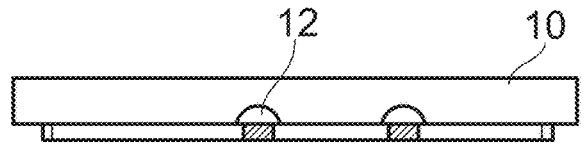

As embodiment of the disclosure is shown in FIGS. 1a, 1b, 1c, 1d and 1e. A semiconductor device comprises a slug 10, which slug 10 comprises a groove or a tunnel 12. FIGS. 1a, 1b and 1c show the top view, the bottom view and the cross-section view of the slug 10 with the groove 12 respectively. FIGS. 1d and 1e show the top view and the cross-section view, of the slug with the groove after the ultrasonic welding, respectively.

Figure 2:
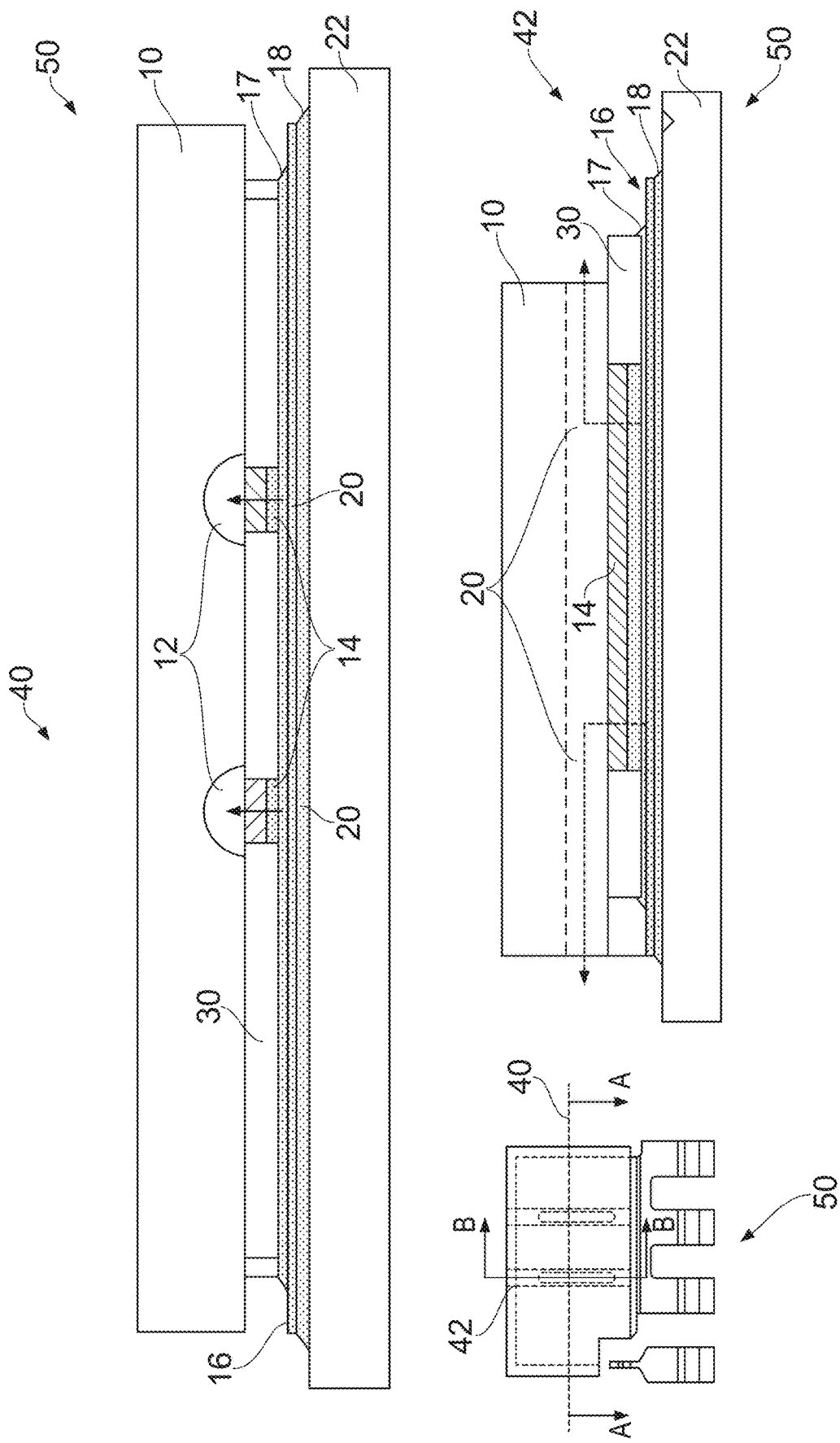
FIG. 2 illustrates a semiconductor device according to an embodiment of the disclosure.

An embodiment of the disclosure is shown in FIG. 2. A semiconductor device 50 is shown from two different cross-sections, a first cross-section A-A 40 and a second cross-section B-B 42. The semiconductor device 50 comprises:
  a leadframe 22,
  a first solder 18 positioned on the top of the leadframe 22,
  a silicon die 16 positioned on the top of the first solder 18,
  a second solder 17 positioned on the top of the silicon die 16,
  a clip 30, wherein the clip comprises a clip slot 14, wherein the clip 30 is positioned on the top of the second solder 17,
  a slug 10, wherein the slug comprises a groove or a tunnel 12, wherein the slug 10 is positioned on the top of the clip 30,
  wherein the groove 12 and the clip slot 14 are at least partially mutually overlapping so to form a gas pathway 20.

This gas pathway 20 secures that any present gas will escape (i.e. will be eliminated) during the solder reflow process. As mentioned previously this feature of the embodiment of the present disclosure will decrease the chance of void formation in the solder between the silicon die 16 and the clip 30. Once more, this will secure the high quality thermal and electrical performance of the semiconductor device.

Figure 3B:
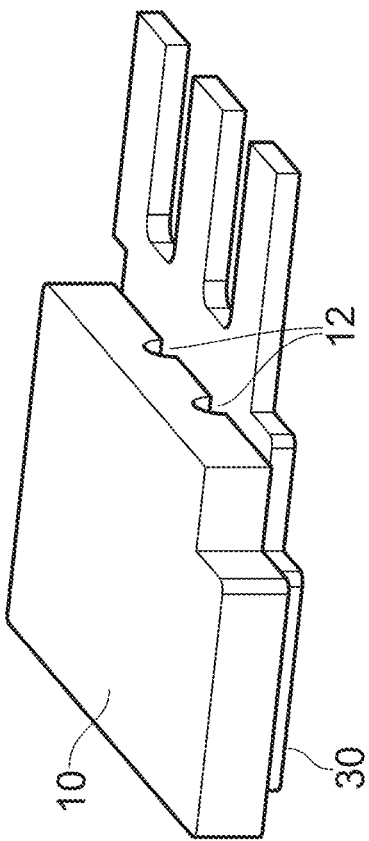
FIGS. 3a, 3b, and 3c illustrate a semiconductor device according to an embodiment of the disclosure.
Figure 3C:
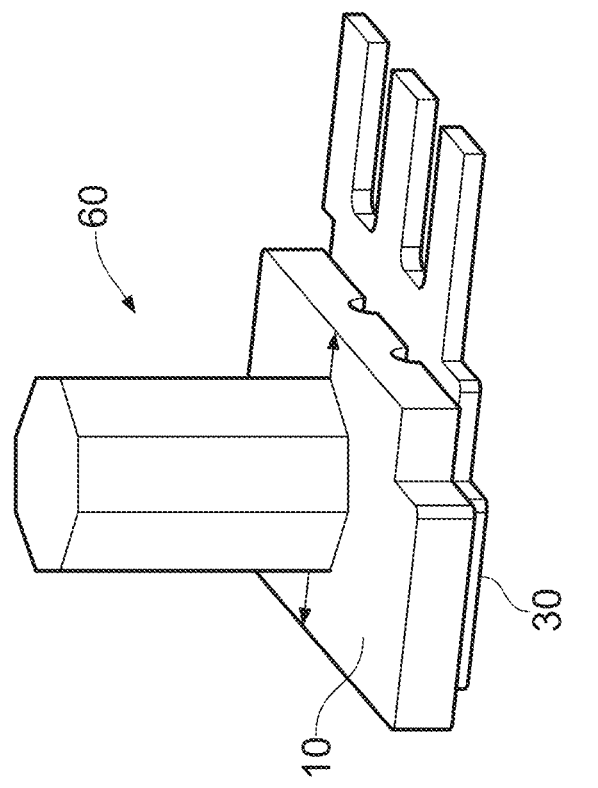
Figure 3A:
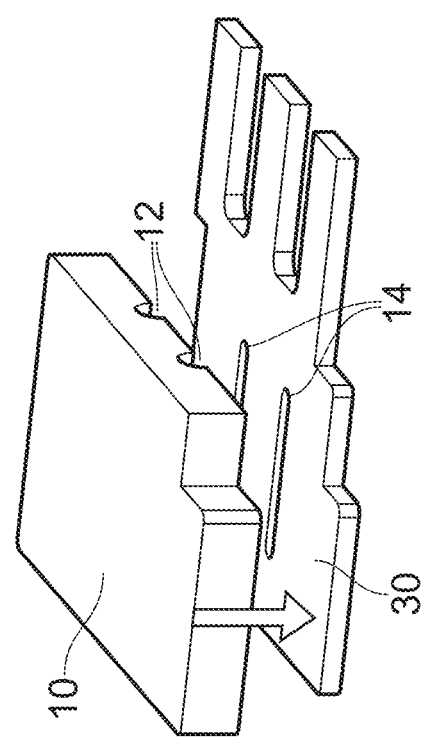

An embodiment of the disclosure is shown in FIGS. 3a, 3b and 3c. The mutual position of slug 10 and a clip 30 before, during and after the ultrasonic bonding is shown in FIG. 3a, FIG. 3b and FIG. 3c respectively. Ultrasonic bonder 60 is shown in FIG. 3b. As shown in FIG. 3a, grooves/tunnels 12 of the slug 10 are aligned in respect to clip slots 14 of the clip 30, i.e. the grooves/tunnels 12 are fully overlapping with the clip slots 14. In this way a gas pathway is formed.

The clip 30 created in this way can be further used in a clip attach process for building dual side cooling packages.

An embodiment of the disclosure relates to a method of creation of dual side cooling packages. The method includes the steps:
  solder stencil printing to a die pad/a leadframe,
  attaching a die to a die pad leadframe with a solder,
  dispensing a solder on the top of the die,
  attaching a clip using a grooved ultrasonic welding, this step is shown in more details in FIGS. 3a, 3b and 3c, and
  molding, PMC deflash and plating.

The shape and the position of the grooves and the clip slots is not limited to the above described embodiments of the disclosure. The disclosure includes all obvious variations of the shapes and the mutual positions of the grooves and the clip slots.

Figure 4:
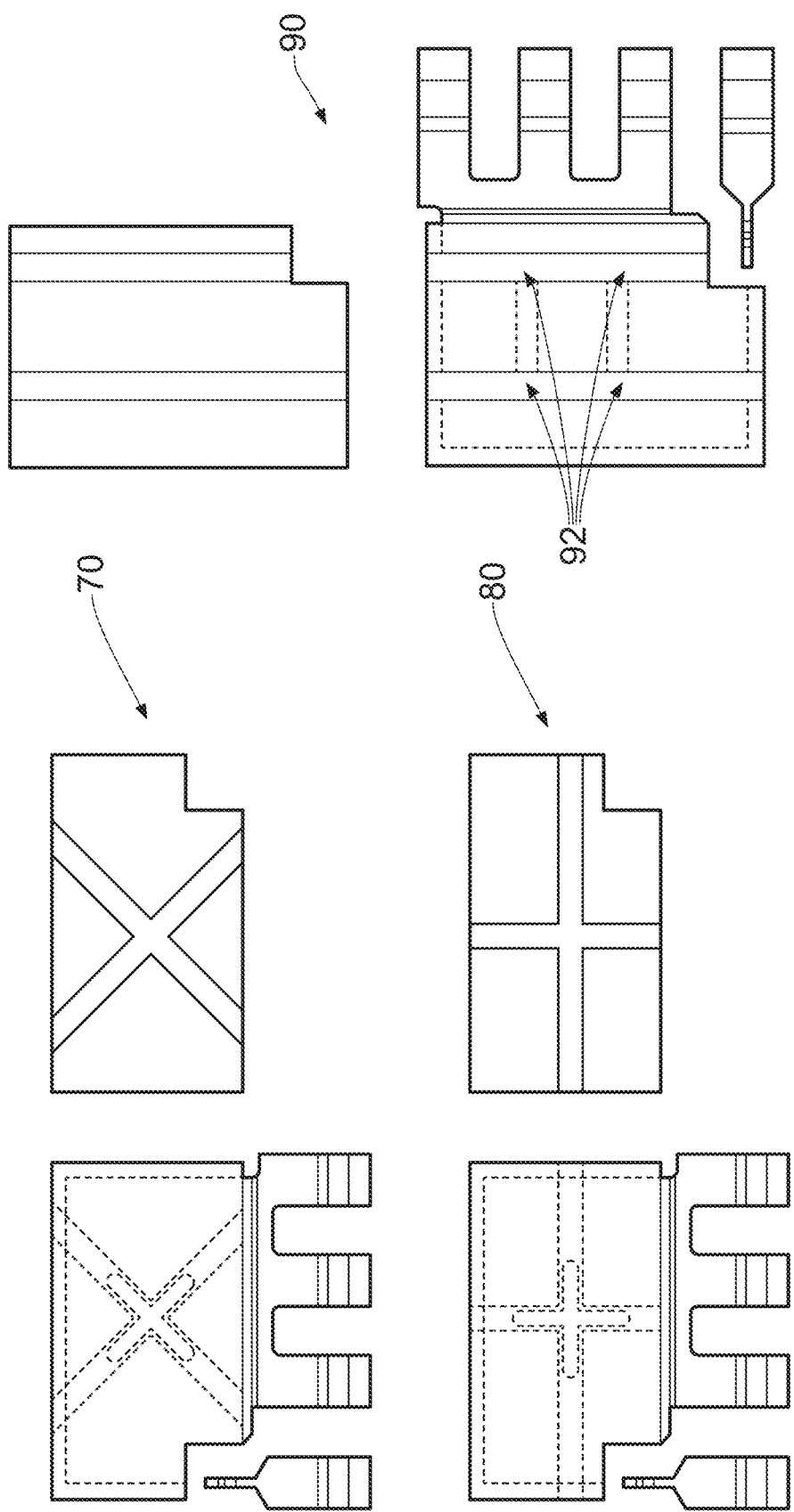
FIG. 4 illustrates three semiconductor devices according to three embodiments of the disclosure.

In exemplary embodiment of the disclosure shown in FIG. 4, a cross shaped 70 and a plus shaped 80 variations are shown, where the grooves and the clip slots significantly overlap with each other.

In another exemplary embodiment of the disclosure shown in FIG. 4, the grooves and the clip slots are not significantly overlapping with each other. This embodiment is marked with the reference number 90. In this embodiment the grooves and the clip slot overlap only partially at the four overlapping points 92.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A semiconductor device comprising:
   a clip, wherein the clip comprises a clip slot; and
   a slug, wherein the slug comprises a groove on an underside of the slug that is encased by the top of the slug,
   wherein the groove and the clip slot are at least partially overlapping to form a gas pathway tunnel on the underside of the slug to an outside side of the slug.

2. The semiconductor device as claimed in claim 1, wherein the clip and the slug are connected by an ultrasonic welding.

3. The semiconductor device as claimed in claim 1, wherein the semiconductor device further comprises:
   a leadframe;
   a first solder positioned on a top of the leadframe;
   a silicon die positioned on a top of the first solder; and
   a second solder positioned on a top of the silicon die,
   wherein the clip and the slug are positioned on a top of the second solder.

4. The semiconductor device as claimed in claim 1, wherein the semiconductor device further comprises at least two grooves and at least two clip slots.

5. The semiconductor device as claimed in claim 2, wherein the semiconductor device further comprises:
   a leadframe;
   a first solder positioned on a top of the leadframe;
   a silicon die positioned on a top of the first solder; and
   a second solder positioned on a top of the silicon die,
   wherein the clip and the slug are positioned on a top of the second solder.

6. The semiconductor device as claimed in claim 2, wherein the semiconductor device further comprises at least two grooves and at least two clip slots.

7. The semiconductor device as claimed in claim 3, wherein the semiconductor device further comprises at least two grooves and at least two clip slots.

8. The semiconductor device as claimed in claim 4, wherein the at least two grooves and the at least two clip slots are overlapping with each other, and wherein the at least two grooves and the at least two clip slots both form a cross-shape.

9. The semiconductor device as claimed in claim 4, wherein the at least two grooves and the at least two clip slots are overlapping with each other, and wherein the at least two grooves and the at least two clip slots both form a plus-shape.

10. The semiconductor device as claimed in claim 4, wherein the at least two grooves and the at least two clip slots are partially overlapping with each other, wherein the at least two grooves and the at least two clip slots form a rectangle-shape, and wherein the at least two grooves correspond to a first two sides of the rectangle-shape and the at least two clip slots correspond to a second two sides of the rectangle-shape, and the overlapping between the at least two grooves and the at least two clip slots is at vertices of the rectangle-shape.

11. A method of producing a semiconductor device as claimed in claim 1.

12. A method of producing a semiconductor device, the method comprising steps of:
    solder stencil printing to a die pad;
    attaching a die to the die pad;
    dispensing a solder on a top of the die;
    attaching a slug to a clip using ultrasonic welding,
    wherein the slug comprises a groove on an underside oft the slug that is encased by a top of the slug, and wherein the clip comprises a clip slot,
    wherein the groove and the clip slot are at least partially overlapping when attaching the slug to the clip to form a gas pathway tunnel on the underside of the slug a to an outside of the slug,
    wherein the groove is positioned on a side of the slug to which the slug is attached to the clip; and
    molding, PMC deflash and plating.

13. The semiconductor device as claimed in claim 4, wherein the at least two grooves and the at least two clip slots are overlapping with each other and are arranged in parallel lines.

* * * * *